United States Patent [19]

Siegel, Jr. et al.

[11] Patent Number: 5,438,992
[45] Date of Patent: Aug. 8, 1995

[54] FLOW-INDUCED ARTIFACT ELIMINATION IN MAGNETIC RESONANCE IMAGES

[75] Inventors: John M. Siegel, Jr., Atlanta; David N. Ku, Decatur; John N. Oshinski, Atlanta; Roderic I. Pettigrew, East Point, all of Ga.

[73] Assignee: Georgia Tech Research Corporation, Atlanta, Ga.

[21] Appl. No.: 146,393

[22] Filed: Nov. 1, 1993

[51] Int. Cl.$^6$ .............................................. A61B 5/055
[52] U.S. Cl. ............................ 128/653.2; 128/653.3; 324/306; 324/309
[58] Field of Search .................... 128/653.2, 653.3; 324/306, 309

[56] References Cited

U.S. PATENT DOCUMENTS 4,993,414  2/1991  Macovski et al. ............... 128/653.3
5,277,192  1/1994  Dumoulin ........................ 128/653.3

Primary Examiner—Ruth S. Smith
Attorney, Agent, or Firm—Hopkins & Thomas

[57] ABSTRACT

Magnetic resonance imaging of a blood vessel exhibits flow artifacts, or signal loss, around a constriction (26) due to turbulent fluid flow. Signal loss in a region (27) prior to the constricted region (26) is primarily caused by convective acceleration, and this signal loss is substantially eliminated by performing an acceleration compensation process. Signal loss in a region (32) situated after the constriction (26) is primarily caused by velocity fluctuations, and this signal loss is cured by an imaging process which does not rely on the phase of the electromagnetic excitation signal(s) for spatial localization. Examples of imaging processes for minimizing signal loss due to turbulence include a projection reconstruction process (34) and a two dimensional slice selection process (56). Further, the two dimensional slice selection process (56) may be used for generating instantaneous velocities of fluid flowing through a fluid channel. Also, if a number of instantaneous velocities are produced over a time period, then fluctuation velocities can be determined via time-resolved averaging.

22 Claims, 14 Drawing Sheets $.5a12+.5a23+a13=f1$
$a11+a22+a33+.5a21+.5a12+.5a23+.5a32=f2$
$a31+.5a21+.5a32=f3$ $a11+a12+a13=f1$
$a21+a22+a23=f2$
$a31+a32+a33=f3$ $a11+a21+a31=f1$
$a12+a22+a32=f2$
$a13+a23+a33=f3$

FLOW-INDUCED ARTIFACT ELIMINATION IN MAGNETIC RESONANCE IMAGES

FIELD OF THE INVENTION

The present invention generally relates to magnetic resonance imaging (MRI), and more particularly, to processes and systems for eliminating flow-induced artifacts, or signal loss caused by turbulence, in MRI systems for imaging fluid flow. The present invention has particular application to MRI systems used for angiography, i.e., the analysis of blood vessels, which systems are sometimes referred to as magnetic resonance angiography (MRA)

BACKGROUND OF THE INVENTION

Complications from arterial diseases, such as myocardial infarctions (MI) and cerebral vascular accidents (CVA), cause a majority of the deaths in the western world. The survival of a patient is highly dependent upon the early diagnosis and treatment of stenotic lesions in blood vessels, which are characteristic of these diseases. Dye contrast x-ray angiography has long provided an invasive means of imaging the blood vessels. However, this procedure is disadvantageous due to the invasiveness of the procedure and the exposure of the patient to potentially harmful ionizing radiation. Magnetic resonance angiography (MRA) was initially thought to be the answer to this problem. It is a non-invasive procedure, and the evidence to date is that the high magnetic fields pose no danger to human cells. However, all MRA imaging processes in use today fail in the critical area of arterial disease detection, because massive signal loss occurs in areas of stenotic flow, thus causing an overestimation of the extent of stenoses or even causing a diagnosis of total occlusion.

Previous researchers have seen signal loss in a variety of situations having fluid flow. The observation of patients with aortic coarctations, which are constrictions in the aorta or other blood vessels, using MRA showed that high velocity flow, as seen in fluid jets through obstructive or regurgitant valves, produces a low intensity area as does turbulent flow. See Simpson et al., "Cine Magnetic Resonance Imaging for Evaluation of Anatomy and Flow Relations in Infants and Children with Coarctation of the Aorta," *Circulation*, v. 78 pp. 142–148 (1988). Generally, turbulent flow refers to fluid flow which is characterized by chaotic motion with various velocity, acceleration, and directional attributes. As described in the foregoing paper, the maximum jet length of fluid flow distal to a coarctation was found to correlate well with the coarctation severity measured by angiography or surgery. Other researchers warn against using this signal loss as an absolute measure of the existence of a coarctation. See Mirowitz et al., "Pseudocoarctation of the Aorta: Pitfall on Cine MR Imaging," *J Comput Assist Tomogr*, v. 14, pp. 753–754 (1990). These researchers found signal loss similar to that seen in a coarctation.

The phenomena of signal loss in magnetic resonance (MR) images is not isolated to coarctations. Researchers examining MR images of turbulent flow through straight tubes and orifice type constrictions found that transition to turbulence did not necessarily cause signal loss, as evidenced by the accurate magnitude imaging of turbulent flow through straight tubes. See Evans et al., "Effects of Turbulence on Signal Intensity in Gradient Echo Images," *Invest Radiol*, v. 23, pp. 512–518 (1988). However, MR images of flow through an orifice showed significant signal loss with increasing construction (i.e., high Reynolds number). The area of reduced signal intensity was shown to increase linearly with Reynolds number, while the relative signal intensity past the orifice was found to decrease linearly with Reynolds number (above the threshold value).

In Krug et al., "MR Imaging of Poststenotic Flow Phenomena: Experimental Studies," *JMRI* v. 1, pp. 585–591(1991), a study of MR images of flow distal to a cosine shaped model stenosis showed that the length of the region of poststenotic changes in signal amplitude and phase increased with stenosis grade at a constant flow rate and that the length of the region of poststenotic changes increased with flow rate at a constant stenosis grade. A further study of flow distal to a cosine shaped stenosis, described in Oshinski, "MRI of Stenotic Flows," PhD Thesis, Georgia Institute of Technology (1993), showed that the signal loss depended on absolute fluid velocity, rather than Reynolds number. The signal loss was allegedly attributed to acceleration gradients and turbulence. The region of signal loss was shown to decrease as the thickness of the imaged region (slice region) was increased.

Several studies have advocated the reduction of echo time as a means for reducing or eliminating signal loss when imaging fluid flow. Improvement has been shown in the imaging of tortuous cerebral vessels with the use of shorter echo times. In this regard, see Schmalbrock et al., "Volume MR Angiography: Methods to Achieve Very ShortEcho Times," *Radiology*, 175:861–865 (1990). One study, described in showed a marked reduction in signal loss when comparing poststenotic (orifice type stenosis) jet velocity measured with an echo time of 3.6 msec as compared to 14 msec. Kilner et al., "Valve and Great Vessel Stenosis: Assessment with MR Jet Velocity Mapping," *Radiology*, v. 178, pp. 229–235 (1991). Other researchers argue that the improvement in MR images of stenotic flow is caused by a decrease in magnetic gradient duration, rather than shortened echo time. For instance, see Urchuk et al., "Mechanisms of Flow-induced Signal Loss in MR Angiography," *JMRI*, v. 2, pp. 453–462 (1992).

In essence, the theoretical explanations for signal loss vary with the gradient sequence used. One analysis assuming only velocity encoding, described in Nalcioglu et al., "Application of MRI in Fluid Mechanics of Turbulent Flow," *7th Annual SMRM Abstracts*, p. 418 (1987), and another with a partial gradient echo sequence Gatenby et al., "Measurement of Turbulent Intensity using Partial Echo Techniques," *12th Annual SMRM Conference Abstracts*, p. 2914 (1992), argue that the fluctuating component of velocity in turbulent flow causes an exponential decline in signal intensity. The same phenomena is said to occur on even echoes of a multiple echo spin echo sequence. See, e.g., De Gennes, P.G. (1969) "Theory of Spin Echoes in a Turbulent Fluid," *Physics Lett*. 29:20–21. Others argue that signal loss using spin-echo imaging or echo-planer imaging can be caused by fluid shear stress. In regard to the former, see Kuethe et al., "Fluid Shear and Spin-Echo Images," *MRM*, v. 10, pp. 57–70 (1989), and in regard to the latter see Kose, "Visualization of Shear Distribution in Turbulent Fluids Using Echo-Planar Imaging," *11th Annual SMRM Conference Abstracts*, p. 362 (1991).

The aforementioned studies show the universal presence of signal loss in areas of constriction, or areas in vessels characterized by both contraction and expansion at high Reynolds numbers. With increasing Reynolds number or increasing degree of constriction, the signal loss has been found to increase. This signal loss has been attributed to a host of flow parameters, including turbulence, high velocities, and high shear rate, and to a host of imaging parameters, including echo time and magnetic gradient duration. Thus, presently in the art, there is neither a consistent explanation for the reason for signal loss nor a solution for the avoidance of signal loss in MR images of turbulent fluid flow.

SUMMARY OF INVENTION

An object of the present invention is to overcome the deficiencies and inadequacies of the prior art as noted above and as further known in the art.

Another object of the present invention is to provide an explanation for signal loss in MR images of fluid flow and to provide a solution for the avoidance of the signal loss in these images.

Another object of the present invention is to provide a process and system for producing MR images of fluid flow which are free from signal loss.

Another object of the present invention is to provide a process and system for eliminating signal loss in MR images of flow geometries having varying cross-section, particularly, MRA images of stenoses, or constrictions, in blood vessels.

Another object of the present invention is to provide a process and system for producing high quality angiographic images.

Another object of the present invention is to provide a very accurate non-invasive means of imaging fluid flow, for example but not limited to, fluid flow through a blood vessel or other channel.

Another object of the present invention is to provide a novel means for imaging a body.

Another object of the present invention is to provide a means of accurately measuring velocity of fluid flow with the presence of turbulence and/or convective acceleration.

Another object of the present invention is to provide a means of obtaining non-averaged velocity measurements of fluid flow.

Briefly described, the present invention involves a discovery by the inventors that conventional phase encoding of images results in signal loss in areas where there is turbulent flow of fluid in a body, for example but not limited to, a human being. This phenomenon causes significant signal loss in fluid flow regions with progressively expanding cross-sections. By eliminating phase encoding, the aforementioned signal loss is eliminated. In short, the non-phase encoding process of the present invention comprises the following steps. A static magnetic field is applied generally to the body for alignment of protons within the body. A particular region of the body in three dimensional space having fluid flow is selected and excited by applying a magnetic gradient(s) and/or an electromagnetic excitation signal(s). In response to the foregoing excitation, an electromagnetic echo signal is propagated from the particular region. Finally, an image of the fluid flow within the particular region is produced by processing the electromagnetic echo signal independent of the phase of the electromagnetic echo signal.

An embodiment of the present invention for eliminating phase encoding involves using a projection reconstruction process. Many different variations of projection reconstruction may be practiced in the present invention. An example embodiment comprises the following steps. A slice region is excited along the body by applying a slice selection magnetic gradient in combination with a slice selection electromagnetic signal at a frequency which specifies the location of the slice region. After exciting the slice region, this region is frequency modulated by applying a shaped magnetic gradient(s). Preferably, the shaped magnetic gradients are applied in two directions within the plane of the slice region. These gradients bring the emitted signal to a peak, termed an "echo," with bands in the frequency spectra of the echo signal being indicative of signal amplitude within certain regions in the slice region. This process is repeated n times for an n by n resolution image. The result of these gradient sequences is a set of n frequency spectra which represent different viewpoints within the plane of the slice region. Postprocessing routines are then used to construct a complete picture of the slice region from the different viewpoints.

Another embodiment of the present invention for eliminating phase encoding is a novel two dimensional slice selection process, which comprises the following steps. A slice region is excited along the body by applying a slice selection magnetic gradient in combination with a slice selection electromagnetic signal at a frequency which specifies the location of the slice region. After exciting the slice region, the magnetization of a row region within the slice is inverted by simultaneously applying a magnetic gradient perpendicular to the row region with an electromagnetic signal of the frequency appropriate to the row region of interest. This row region is then frequency modulated by applying a magnetic gradient parallel to the row region until an echo signal is achieved. The frequency spectra of this echo signal is then representative of individual pixels within this row region. This process is repeated for all row regions within the plane of the slice region and the resultant image of the slice region is produced by combining the images from all of the row regions of the slice region.

It should be noted that other embodiments for eliminating phase encoding are possible and that the two embodiments set forth above (projection reconstruction; two dimensional slice selection) are merely an exemplary listing, not an exhaustive listing.

Still another embodiment of the present invention is a process for measuring the instantaneous velocity in a fluid channel, which does not average the velocity over multiple acquisitions. Further, fluctuation velocities within fluid flow can be obtained using multiple samplings of instantaneous velocities. In short, the process can be described as follows. The aforementioned 2D slice selection imaging sequence is applied to a given row with a small modification. The gradient waveform in the direction for which velocity is to be determined is shaped such that fluid velocity will produce a phase shift in the echo signal. In the remaining two directions, the gradient waveforms are shaped such that fluid velocity produces no net phase shift in the echo signal (known as velocity compensation or first order gradient moment nulling). This sequence is reapplied to the same row with velocity compensated gradients in all three directions. The phase from each pixel of the first sequence is subtracted from the phase of each pixel of the second sequence, and the resultant phase shaft is proportional to fluid velocity. These pixel velocities are not averaged over multiple acquisitions as would be done in projection reconstruction sequence or in any traditional imaging sequence. Therefore, an instantaneous, or non-averaged, velocity is measured.

In accordance with yet another embodiment of the present invention, the inventors have determined that signal loss in a magnetic resonance image of fluid flow through a varying cross-sectional area is caused by a range of convective acceleration (or deceleration) values within each pixel of the image. This type of signal loss is substantially eliminated by modifying the shape of the magnetic gradient in the direction of the fluid acceleration (known as acceleration compensation or second order gradient moment nulling). Preferably, the gradients are shaped such that the phase of the final signal is insensitive to fluid position and velocity as well.

Other objects, features, and advantages of the present invention will become apparent to one of skill in the art upon examination of the following drawings and detailed description.

BRIEF DESCRIPTION OF THE DRAWINGS

The present invention can be better understood with reference to the following drawings. The drawings are not necessarily to scale, emphasis instead being placed upon clearly illustrating principles of the present invention.

DETAILED DESCRIPTION OF THE PREFERRED EMBODIMENT

Figure 1:
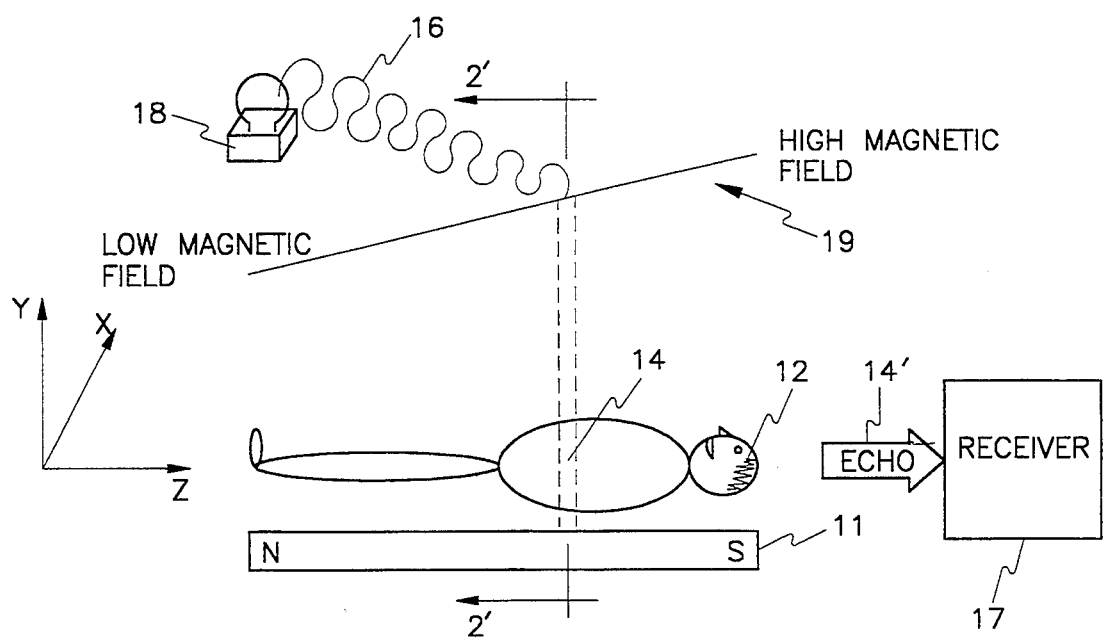
FIG. 1 is a side schematic view of MRI of a body.

Referring now to the drawings wherein like reference numerals designate corresponding parts throughout the several views, FIG. 1 illustrates a conventional magnetic resonance imaging (MRI) process for generating magnetic resonance (MR) images of a body 12, shown by way of example as a person, for the purpose of viewing and analyzing internal parts within the body 12. Needless to say, the principles described hereafter relative to obtaining MR images of the body 12 can be applied to other scenarios for obtaining MR images of virtually anything in virtually any body or thing. When blood vessels are sought to be imaged in a person 12, the process is usually referred to as magnetic resonance angiography (MRA).

MRI generally involves the steps of applying a magnetic field(s) to the body 12 so as to align the rotational axes of protons in the body 12 in a preferential direction, modifying the direction of the rotational axes with magnetic gradients and/or electromagnetic excitation signals (usually RF signals) in a specific body area, permitting the protons to recover to their original orientation so that the protons emit an electromagnetic echo signal 14', and receiving and analyzing the electromagnetic echo signal 14' with a receiver 17 in order to generate images of the specific body area.

More specifically, with reference to FIG. 1, a static magnetic gradient is applied to the body 12 by magnet 11 so as to align the rotational axes of protons in the body 12 in a preferential direction. Next, both a slice selection magnetic gradient and an electromagnetic excitation signal are applied to the body 12 in order to select and isolate a slice region 14 within the body 12 situated along an axis z. The concept is based upon the following Larmor equation: $\omega = \lambda B$, where $\omega$ is the Larmor frequency of precession (a resonant frequency), $\lambda$ is a constant of proportionality known as the gyromagnetic ratio, and $B$ is the local magnetic field strength. As an example, FIG. 1 shows a linear slice selection magnetic gradient 19 applied to the body 12. It can be seen from the foregoing equation that a particular frequency $\omega$ excites only a particular slice region 14 of the body 12 to be imaged. Thus, any slice region 14 along the body 12 and axis z may be selectively localized and imaged by the receiver 17 by varying the frequency of the electromagnetic excitation signal 16 emitted from transmitter 18.

Figure 2:
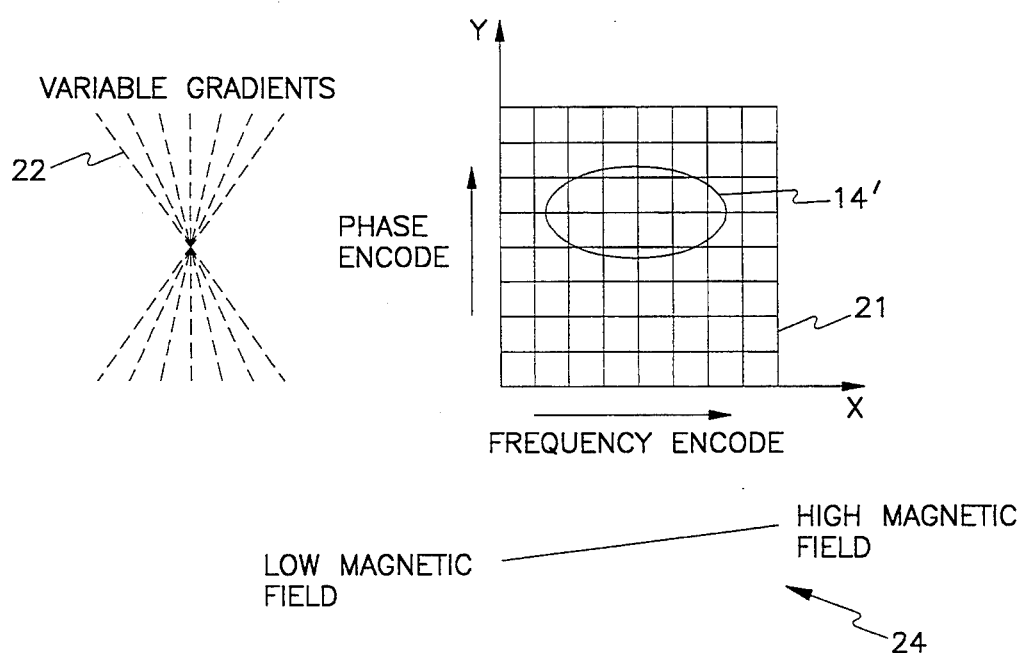
FIG. 2 is a graph showing a cross-section of an MRI image of the body, called a slice region, taken along line 2'—2' of FIG. 1 and showing frequency/phase encoding for localizing pixels within the slice region.

After a slice region 14 has been isolated, the slice region 14 is encoded in phase-frequency space 21 (known as "k space") in order to localize the slice region 14 further to particular picture elements (pixels). As shown in FIG. 2, a magnetic gradient 22, for example, a linear magnetic gradient, is briefly applied in the y-direction (phase encoding direction) in order to provide an echo phase shift which is proportional to the position on the y-axis. Next, a magnetic gradient 24 is applied along the x-axis while the output signal achieves a peak or echo signal 14 which is received and processed by the receiver 17. This gradient produces a resultant signal with a frequency which is proportional to position along the x-axis. The preceding process is repeated with different magnetic gradients 22, for n times, where n represents the resolution of the image.

As mentioned in the background section hereinbefore, MRA exhibits a wide variety of flow artifacts, or signal loss. In the prior art, signal loss in an MR image of fluid flow has been attributed to high velocities, acceleration, range of velocities within a pixel, pulsatility of flow, and turbulence in the flow field. Several of these artifacts may be corrected using velocity compensated magnetic gradients, short echo times, and gating of the image acquisition to the pulsatile wave form. However, to date, there is no process for the avoidance of signal loss due to turbulent fluid flow. In essence, the inventors herein assert that a primary reason for signal loss in turbulent flow is a misregistration of spatial position in the phase encoded imaging direction, or in the y-direction of FIG. 3. This misregistration can be cured by an imaging process which does not rely on the phase of the electromagnetic echo signal 14' for spatial localization. Such non-phase processes are described in detail hereafter.

The key to understanding the present invention is to divide MRA signal loss into two categories: intravoxel signal loss and intervoxel signal loss. Intravoxel signal loss is caused by the spatial variation of a fluid motion, such as velocity or acceleration. This spatial variation can cause a range of signal phases within a pixel, resulting in a reduced signal intensity for the pixel. Intervoxel signal loss, on the other hand, results from a temporal variation in a fluid parameter. This temporal variation can cause different phase shifts at different times in the phase encoding process. This results in the signal being misplaced in the phase encoded direction, and appears as a smearing, or ghosting of the image in the phase encoding direction. This phenomena is classically seen in images with pulsatile flow, where the image acquisition is not gated to the flow waveform.

Most of the current literature on turbulent signal loss focuses upon utilizing magnetic gradient waveforms which are insensitive to high orders of motion (such as acceleration and jerk) in an attempt to eliminate turbulent signal loss. Furthermore, none of the current literature discusses the problem upstream of a constriction, where signal loss also occurs.

Using the foregoing concepts, turbulent signal loss could, conceivably, be grouped in both categories. The mean flow in a turbulent flow field traditionally has a shear stress (velocity gradient multiplied by viscosity) which supplies the turbulent eddies with energy. This could cause intravoxel signal loss. The fluctuating components of velocity, on the other hand, could cause intervoxel signal loss similar to that seen in ungated pulsatile flow images. The dominant cause of MRA signal loss can be seen by observing an MRA image of a stenotic flow field. The images at location 32 of FIG. 3 clearly show the same phase smearing seen in ungated pulsatile images, thus indicating that turbulent signal loss is a problem dominated by spatial misregistration of the signal in the phase encoding direction and therefore falls into the category of intervoxel signal loss. Furthermore, the inventors' research shows that a majority of the signal loss seen prior to a constriction (FIG. 3, location 27) is caused by a large range of convective acceleration, and is therefore a type of intravoxel signal loss.

The above reasoning provides an answer as to why historical image compensation approaches do nothing to eliminate turbulent signal loss. A historical approach assumes that the signal loss is intravoxel in nature and therefore complicated gradient waveforms are designed to compensate for the effect. This approach is very effective in avoiding intravoxel signal loss, as seen in high shear flows, but does little when the signal loss is caused by complicated temporal fluctuations (intervoxel signal loss).

The solution, therefore, would be to utilize an angiographic sequence which does not depend upon phase encoding as a means of spatially localizing regions to be imaged and to utilize magnetic waveforms which compensate for position, velocity, and acceleration. Some sequences without phase encoding have been described previously and were among the first used in the field of MR imaging. However, these sequences were abandoned for the most part, in favor of the 2D Fourier (frequency-phase) images which today are used almost exclusively in commercial MR imaging. Over the past several years, articles describing backprojection images for MR (which are not phase encoded) have periodically appeared in the literature, but 2D Fourier imaging has remained the standard for imaging sequences. These backprojection sequences are rarely used for angiograms and have never been used for quantitative velocity measurements.

The introductory section of one article, Axel et al., "Linogram Reconstruction for Magnetic Resonance Imaging (MRI)," *IEEE Trans Med Imaging*, v. 9, pp. 447–449 (1990), suggested that the backprojection method could reduce turbulent signal loss by reducing the echo time of the imaging sequence. While it is a common observation that the reduction of echo time reduces turbulent signal loss, the concept of eliminating signal loss by using a non-phase localized image is novel. The actual means for elimination of the phase encoding is unimportant; however, specific example of processes for accomplishing this end are described hereinafter.

Turbulent flow also causes inaccuracies in MR fluid velocity measurements due to the incorrect positioning of the velocity values in the phase encoding direction. The newly described techniques for eliminating signal loss in MR angiograms can also be used to eliminate inaccuracies in fluid velocity measurement caused by turbulent flow. This is achieved by using the non-phase encoded sequences with shaped gradient waveforms to determine velocity values.

In summary, the inventors have discovered that signal loss due to turbulent flow can be generally eliminated by eliminating phase encoding. Furthermore, the inventors have discovered that convective acceleration also contributes to the signal loss seen in flow geometries with varying cross-sectional area. This acceleration signal loss can be eliminated by designing gradient waveforms which are insensitive to fluid acceleration. Flow artifacts can be further reduced by the utilization of gradient waveforms which are insensitive to velocity and position, as well as acceleration. The above techniques can be combined for the artifact-free imaging of flow geometries which create turbulent flow and which have varying cross-sectional area.

Non-Phase Encoded Imaging Process

Figure 3:
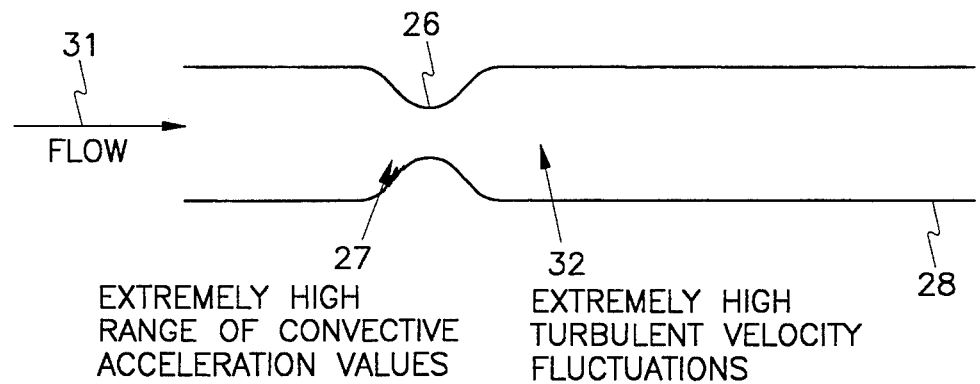
FIG. 3 is a side schematic view showing fluid flow through a channel, for example, a blood vessel in the body of FIG. 1.
Figure 4:
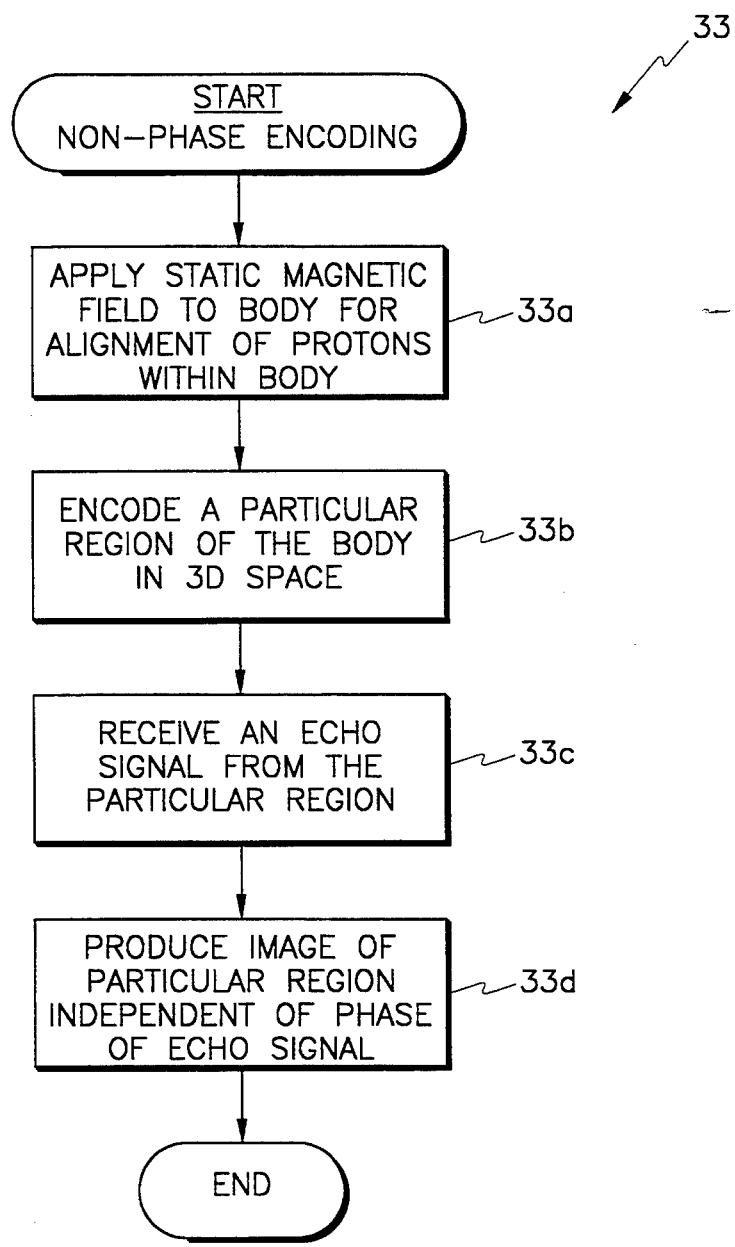
FIG. 4 is a flow chart of a non-phase encoding process of the present invention.

A non-phase encoding process 33 for eliminating phase encoding so as to substantially minimize signal loss at location 32 of FIG. 3 and, to a lesser extent but still significant, at location 27 of FIG. 3 is illustrated by way of a flow chart in FIG. 4. In short, the non-phase encoding process 33 comprises essentially the following steps. As indicated in flow chart block 33a, the static magnetic field 11 is applied generally to the body 12 for alignment of protons within the body 12. Next, as indicated in flow chart block 33b, a particular region 14 of the body 12 in three dimensional space having fluid flow is selected and excited by applying a magnetic gradient(s) and/or an electromagnetic excitation signal(s). In response to the foregoing excitation, an electromagnetic echo signal 14' is propagated from the particular region 14 and received by the receiver 17, as noted at flow chart block 33c. Finally, as specified in flow chart block 33d, an image of the fluid flow within the particular region 14 is produced by processing the electromagnetic echo signal 14' independently of the phase of the electromagnetic echo signal 14'.

Projection Reconstruction Process

Figure 6:
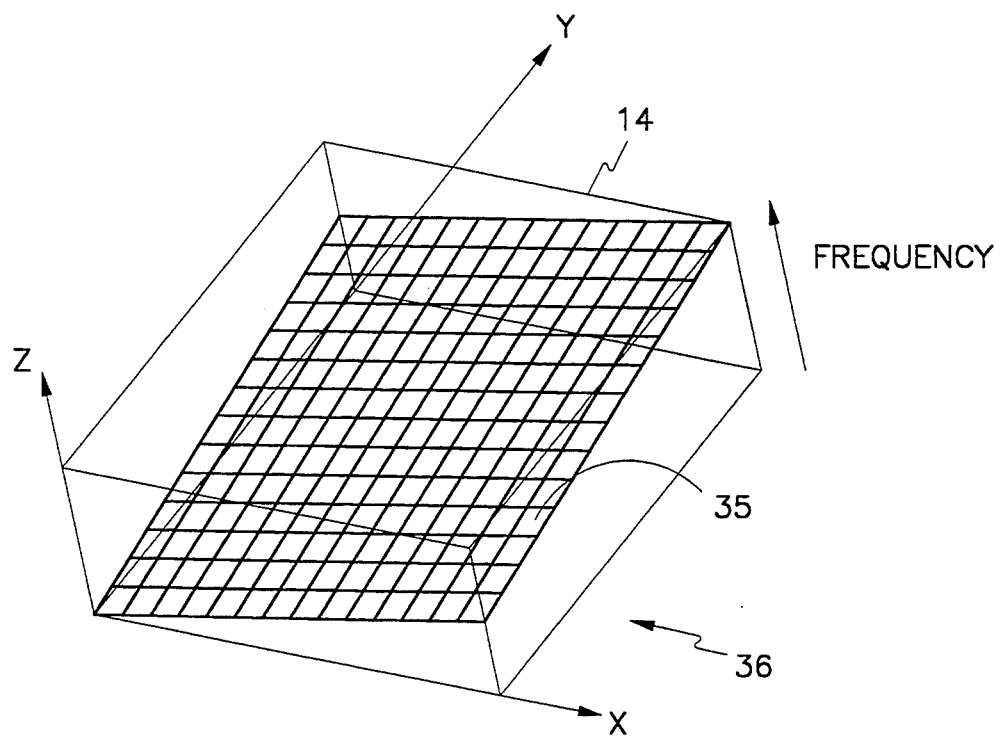
FIG. 6 is a three dimensional graph illustrating the projection reconstruction process of FIG. 5.

A process for eliminating the phase encoded direction, which is invariably present in prior art embodiments, is to encode by frequency in two directions. This objective is accomplished in the present invention by utilizing a process 34 which will be referred to as a projection reconstruction process. Various types of projection reconstruction processes are known in the art, and they are sometimes referred to as back projection processes. Any conventional projection reconstruction process may be employed for practicing the present invention. The projection reconstruction process 34 in accordance with the present invention will now be described by way of flow chart in FIG. 5 and three dimensional graphs in FIGS. 6 and 7.

Figure 5A:
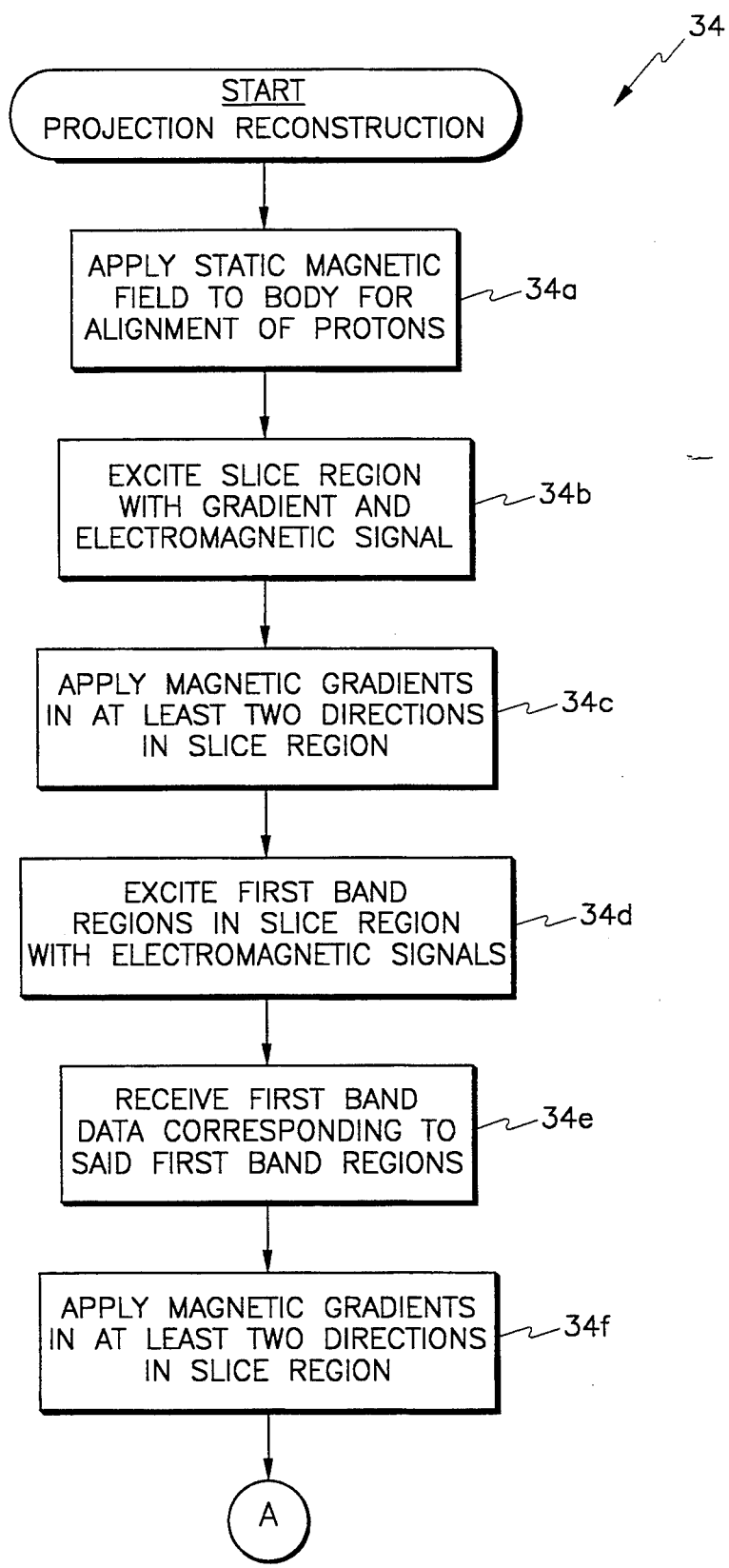
FIGS. 5A and 5B is a flow chart of a projection reconstruction process of the present invention.
Figure 5B:
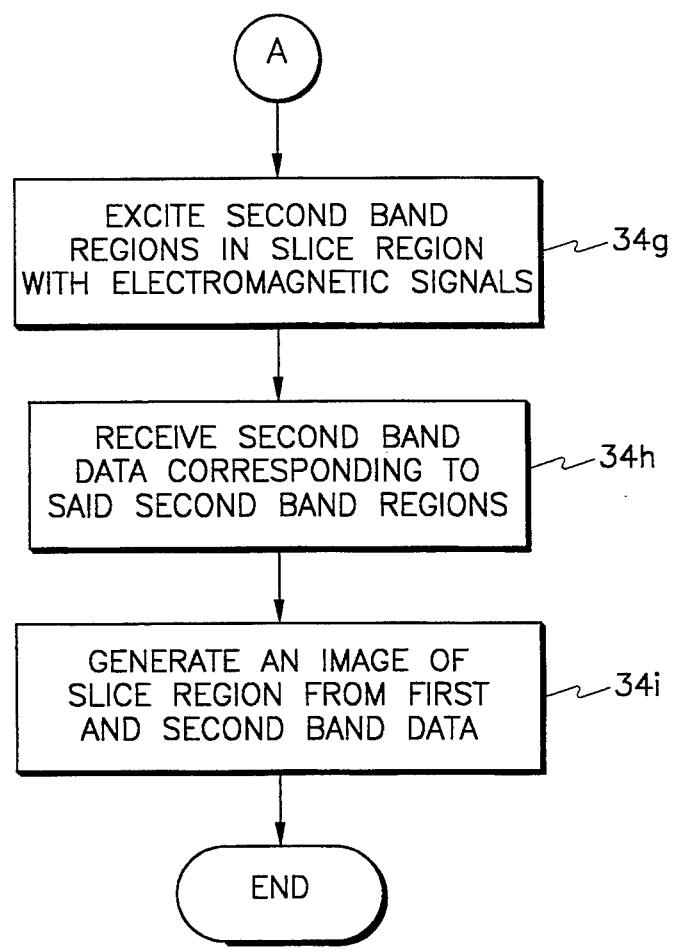

The projection reconstruction process 34 is generally summarized in flow chart blocks 34a–34i of FIG. 5. First, the static magnetic field 11 is applied to the body 12, and a slice region 14 of the body 12 is excited by application of a slice selection magnetic gradient and/or an electromagnetic excitation signal of appropriate frequency. Next, the slice region 14 is frequency modulated by the application of a magnetic gradient in the plane of the slice. Preferably, two magnetic gradients are applied to the slice region 14 in orthogonal directions in the plane of the slice region 14, thereby creating a gradient plane 35 shown in FIG. 6 in three dimensional space defined by frequency versus x-direction versus y-direction. Using this gradient scheme, the protons in the slice region 14 are refocused to forman echo signal which is received and processed. This process is repeated with differing x and y magnetic gradients to obtain different gradient planes 35, or "views" of the slice region 14. Finally, an image of the slice region 14 is generated from the data given by each of these gradient planes 35 combined.

It should be noted that at least two gradient planes 35 must be generated in order to perform the projection reconstruction process 34. With two gradient planes 35, a 2×2 pixel matrix is generated. The more gradient planes 35 generated and processed, the higher the resolution of the ultimate image. Essentially, n image acquisitions must be obtained for generating an image having a resolution of n×n.

Figure 7:
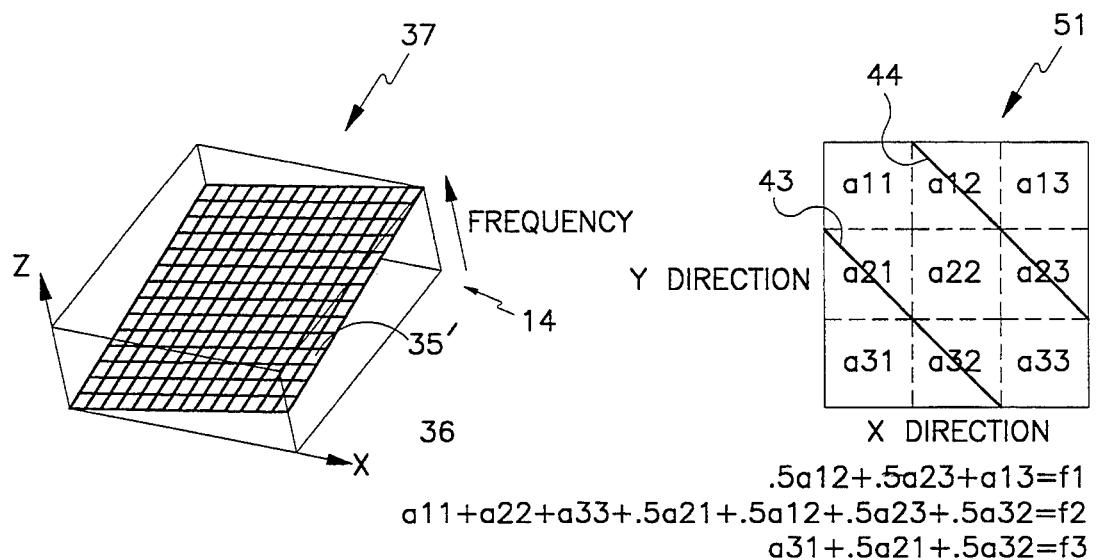
FIG. 7 is a specific example of a series of three dimensional graphs with associated pixel image sequences for implementing the projection reconstruction process of FIG. 5.
Figure 7:
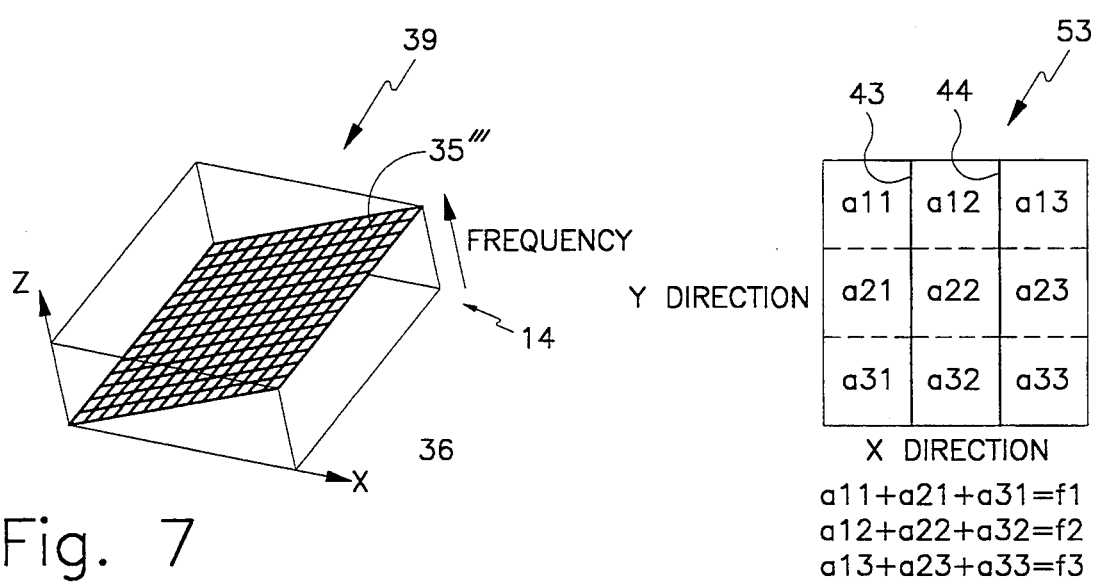

For purposes of clarification, FIG. 7 illustrates an example of the projection reconstruction process 34 wherein a 3×3 pixel matrix is produced by acquiring three separate images of the slice region 14. First, the slice region 14 of the body 12 is selected and the electromagnetic echo signal 14' is measured during the simultaneous application of x-direction and y-direction magnetic gradients to the slice region 14. By the Larmor equation, the magnetic gradients applied in the x- and y-directions alter the frequency of the electromagnetic echo signal 14'. Because these magnetic gradients are applied in two directions x, y, a gradient plane 35' of echo frequencies is created, as shown in FIG. 7. The emission frequency depends upon the x and y location in the slice region 14. If the electromagnetic echo signal 14' is transformed by Fourier transformation, a plot of frequency versus signal intensity can be obtained. This plot can be divided into three frequency bands, such that each band represents the echo signal 14' from a group of pixels, as shown at reference number 51.

In the graph illustrated at reference numeral 37, the bands are obtained by projecting the frequencies f1,f2,f3 along the z-axis against the gradient plane 35'. In this example, three bands are obtained, as divided by diagonal lines 43, 44 in associated matrix 51 (a11–a33). As shown at reference numeral 51, the intensity value obtained at frequency f1 represents the resultant intensity of half of pixel a12, half of pixel a23, and pixel a13. In mathematical terms, this is represented as follows: f1=(0.5) (a12)+(0.5) (a23)+(a13). Another band is generated at the frequency f2 and represents the intensity values of all, a22, a33, and half of a12, a23, a21, and a32. This is represented mathematically as follows: f2=a11+a22+a33+(0.5)(a21)+(0.5) (a12)+(0.5) (a23)+(0.5) (a32). Furthermore, the third band is generated at the frequency f3 and its intensity value is derived by a31 and half of a21, a32, or mathematically: f3=a31+(0.5) (a21)+(0.5) (a32).

The preceding procedure is repeated two more times with a different magnetic gradient each time, as indicated by gradient planes 35'', 35''' at respective graphs 38, 39, in order to produce two more sets of bands 52, 53. As is apparent by the matrices illustrated at reference numerals 51, 52, 53, the pixel intensity values a11–a33 can be determined by the following mathematical equations:

$$(0.5)\ a12+(0.5)\ a23+a13=f1$$

$$a11+a22+a33+(0.5)\ a21+(0.5)\ a12+(0.5)\ a23+(0.5)\ a32=f2$$

$$a31+(0.5)\ a21+(0.5)\ a32=f3$$

$$a11+a12+a13=f1$$

$$a21+a22+a23=f2$$

$$a31+a32+a33=f3$$

$$a11+a21+a31=f1$$

$$a12+a22+a32=f2$$

$$a13+a23+a33=f3$$

In a clinical imaging sequence, the equations for a particular resolution image can be easily written and processed in matrix format, and therefore, the procedure for reconstructing the image is greatly simplified and enhanced.

In a practical imaging sequence, the maximum frequency obtained for a given sequence can be limited by the following equation:

$$LGx+LGx=\text{constant}$$

where Gx and Gy are the x-direction and y-direction magnetic gradients and where L×L is the dimensions of the region being imaged.

Figure 8:
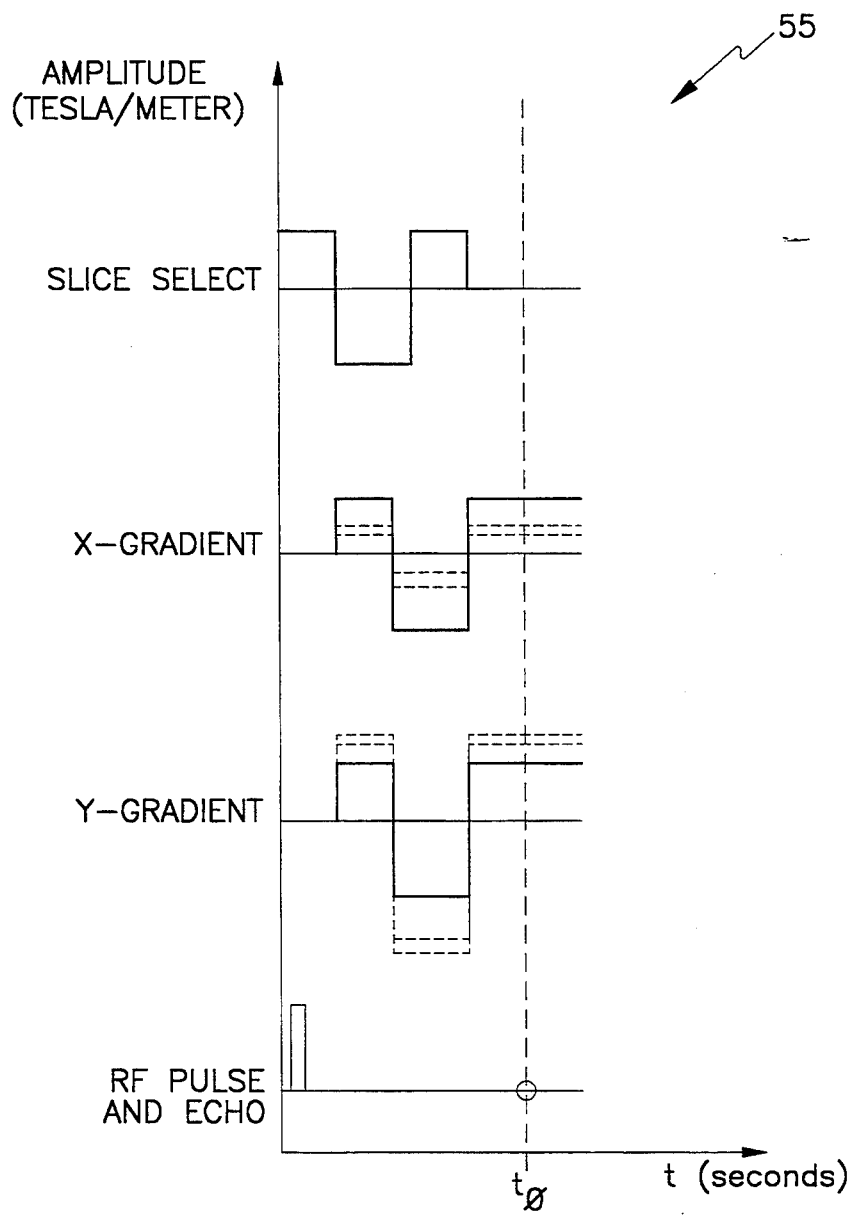
FIG. 8 is a graph showing a magnetic gradient sequence for the projection reconstruction process of FIG. 5.

The concept of bidirectional frequency encoding can be implemented via a magnetic gradient sequence 55 shown in FIG. 8. The concept of gradient sequences is well known in the art. In essence, a gradient sequence is a graph of the magnetic gradients which are applied to the body 12 over time in order to encode a part of the body 12. In FIG. 8, the measurement of the slice region 14 by the receiver 17 occurs at time $t_0$. The magnetic gradient sequence 55 of FIG. 8 uses a refocusing gradient and is velocity compensated in all directions. Even with flow compensation, the approximate echo time for the sequence is approximately 6.5 ms. An alternative is to eliminate flow compensation, thereby achieving shorter echo times (for example, on the order of 2 ms). By using the magnetic gradient sequence 55 of FIG. 8, signal loss due to turbulence, especially at location 32 is substantially eliminated.

Two Dimensional (2D) Slice Selection Process

Figure 9:
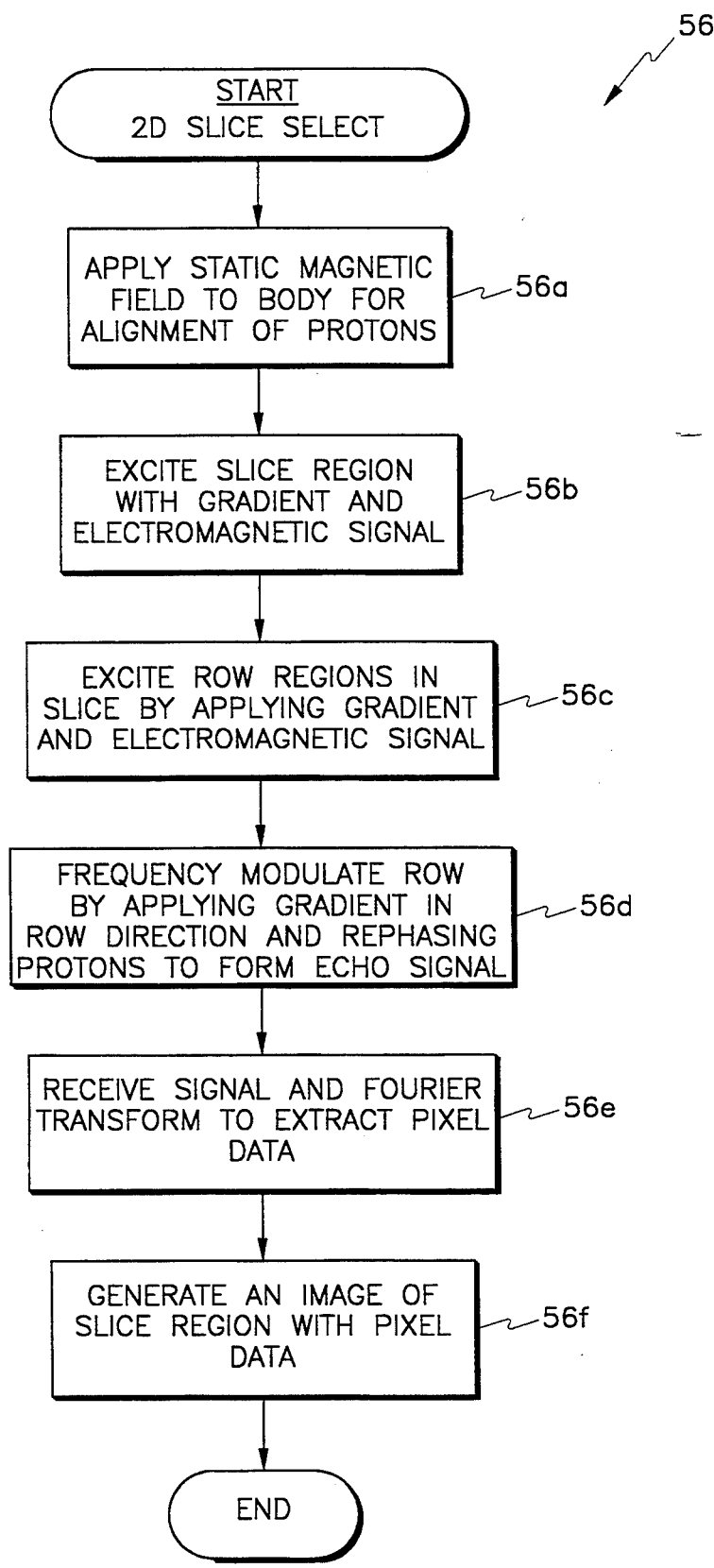
FIG. 9 is a flow chart of a two dimensional slice selection process of the present invention.

Phase encoding may also be eliminated via a novel two dimensional (2D) slice selection process 56, illustrated by way of flow chart with blocks 56a–56f in FIG. 9, in accordance with the present invention. An advantage of the 2D slice selection process 56 is that each pixel value is obtained instantaneously and is not composed of some kind of reconstruction over a number of encoding steps, as with the projection reconstruction process 34 described previously.

Figure 10:
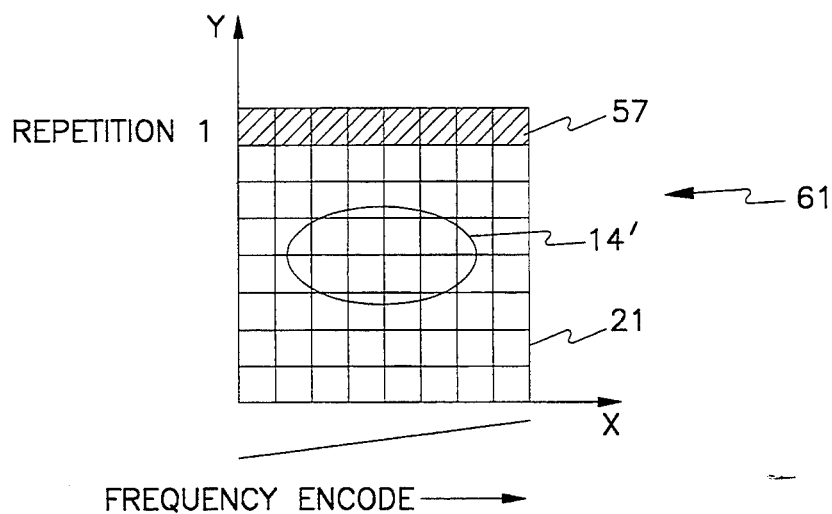
FIG. 10 is a graph illustrating the two dimensional slice selection process of FIG. 9.
Figure 10:
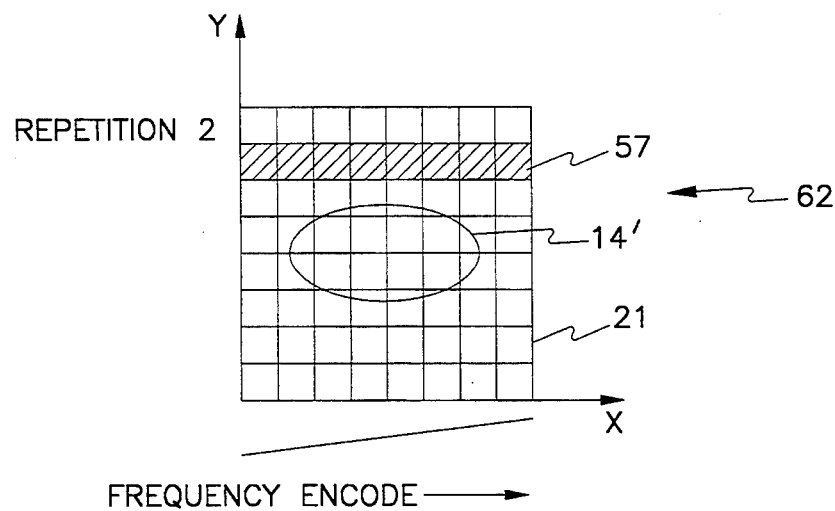
Figure 10:
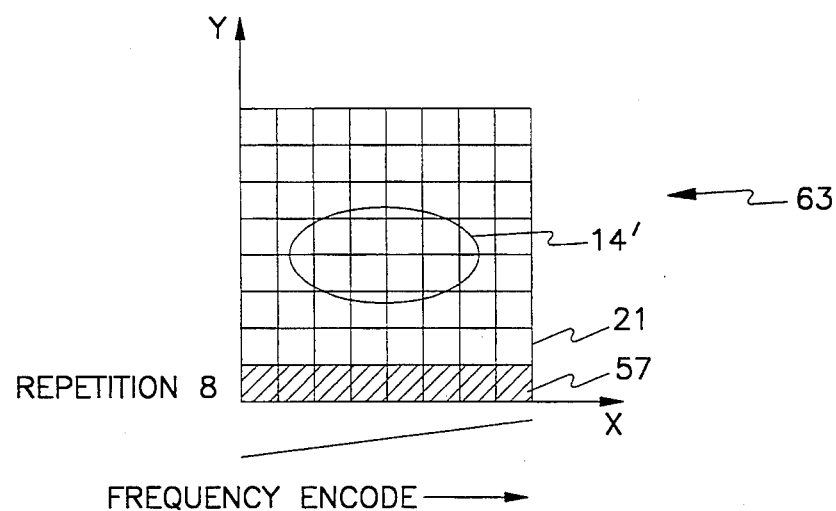

The 2D slice selection process 56 can be better understood with reference to FIG. 10 in combination with the flow chart of FIG. 9. In the 2D slice selection process 56, the static magnetic field 11 is applied to the body 12, and the slice region 14 is initially selected and isolated, as shown and described previously relative to FIG. 1. Then, a row region 57 within the slice region 14 is selected and isolated with a magnetic gradient (applied perpendicular to the direction of the row in the plane of the slice) in combination with an electromagnetic inversion pulse. For instance, see row region 57 at reference graph 61 in FIG. 10. The selected row region 57 is frequency encoded in the x-direction so as to select and isolate particular smaller regions, or pixels. Alternatively, specific pixel regions within each row region can be encoded by applying a row selection electromagnetic signal at a frequency which particularly specifies the location of the row region. Next, the pixel values are transformed via Fourier transformation in order to obtain intensity values at particular pixels. The foregoing procedure is repeated for all row regions 57 within the slice region 14 in order to generate a full image. For simplicity and by way of example, FIG. 10 shows retrieval of pixel values from three row regions 57, taken during imaging repetitions 1, 2, and 8.

Figure 11:
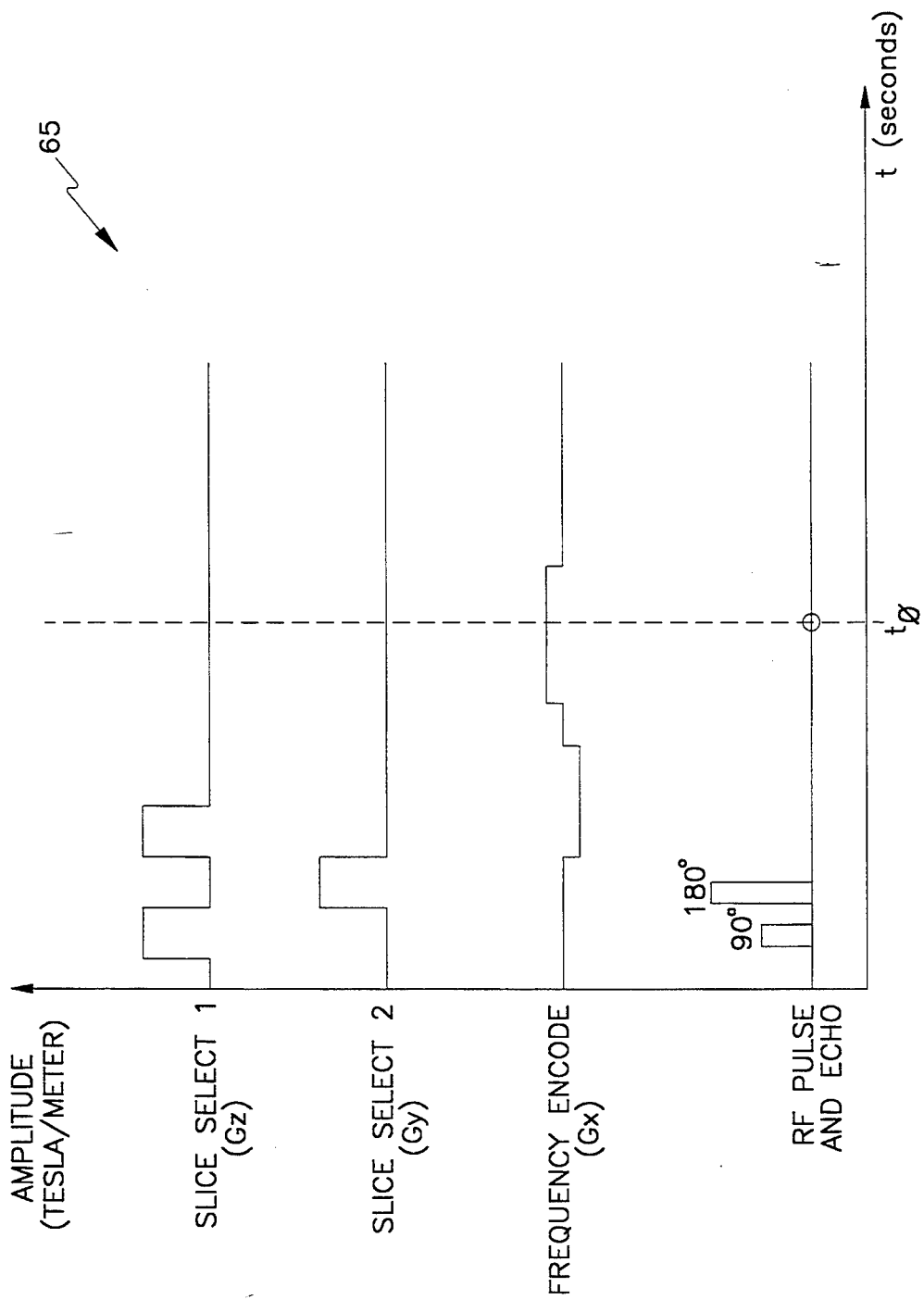
FIG. 11 is a graph showing a magnetic gradient sequence for the two dimensional slice selection process of FIG. 9.

A magnetic gradient sequence 65 for the 2D slice selection process 56 is illustrated in FIG. 11. First, a slice region 14 is excited by the simultaneous application of a slice selection magnetic gradient and an electromagnetic excitation signal of the appropriate frequency, as described previously relative to FIG. 1. This electromagnetic excitation signal is applied for a length of time necessary to tip the protons in the slice region 14 by 90 degrees out of alignment with the static magnetic field 11. Next, a magnetic gradient is applied in one direction (for instance, y-direction) of the orthogonal directions in the x-y plane of the slice region 14 and an electromagnetic excitation signal of appropriate frequency is applied for a length of time necessary to alter the alignment of the protons by 180 degrees at a y-position determined by the frequency of the electromagnetic excitation signal. At this point in time, within the x-y plane of the slice region 14, a single row region of pixels has been tipped by 270 degrees out of alignment (90 degrees + 180 degrees) and all other row regions have been tipped by 90 degrees (due to the slice select magnetic gradient applied in the y-direction, only a single row region received the 180 degree pulse). Finally, a magnetic gradient is applied in the x-direction until an electromagnetic echo signal 14' is generated and the echo signal 14' is measured. The electromagnetic echo signal 14' comes only from the row region which has been tipped by 270 degrees because magnetic gradients applied to the 90 degree row regions will dephase the protons, but magnetic gradients applied to the 270 degree row regions will rephase the protons. Thus, the electromagnetic echo signal 14' comes from a single row region which is spatially localized by frequency in the x-direction. The magnetic gradient sequence 65 of FIG. 11 is repeated n times for the n row regions in the x-y plane of the slice region 14 so as to obtain an intensity value for each pixel in the x-y plane. The actual numerical angle of proton alignment is not important for this sequence—the key to the sequence is that the protons in the slice first receive an excitation pulse and then only the protons in the row of interest receive an inversion pulse.

Instantaneous Velocity Measurement Process

A significant advantage of the magnetic gradient sequence 65 for the 2D slice selection process 56 is that each pixel value is obtained instantaneously (the velocity is only an average over the echo time, not over multiple acquisitions). The magnetic gradient waveforms shown in FIG. 11 need only be slightly modified to provide an echo phase shift which is proportional to instantaneous velocity in a desired direction. Further, using this process, turbulent velocity fluctuation intensities can be monitored by measuring several instantaneous velocities over time.

Figure 12A:
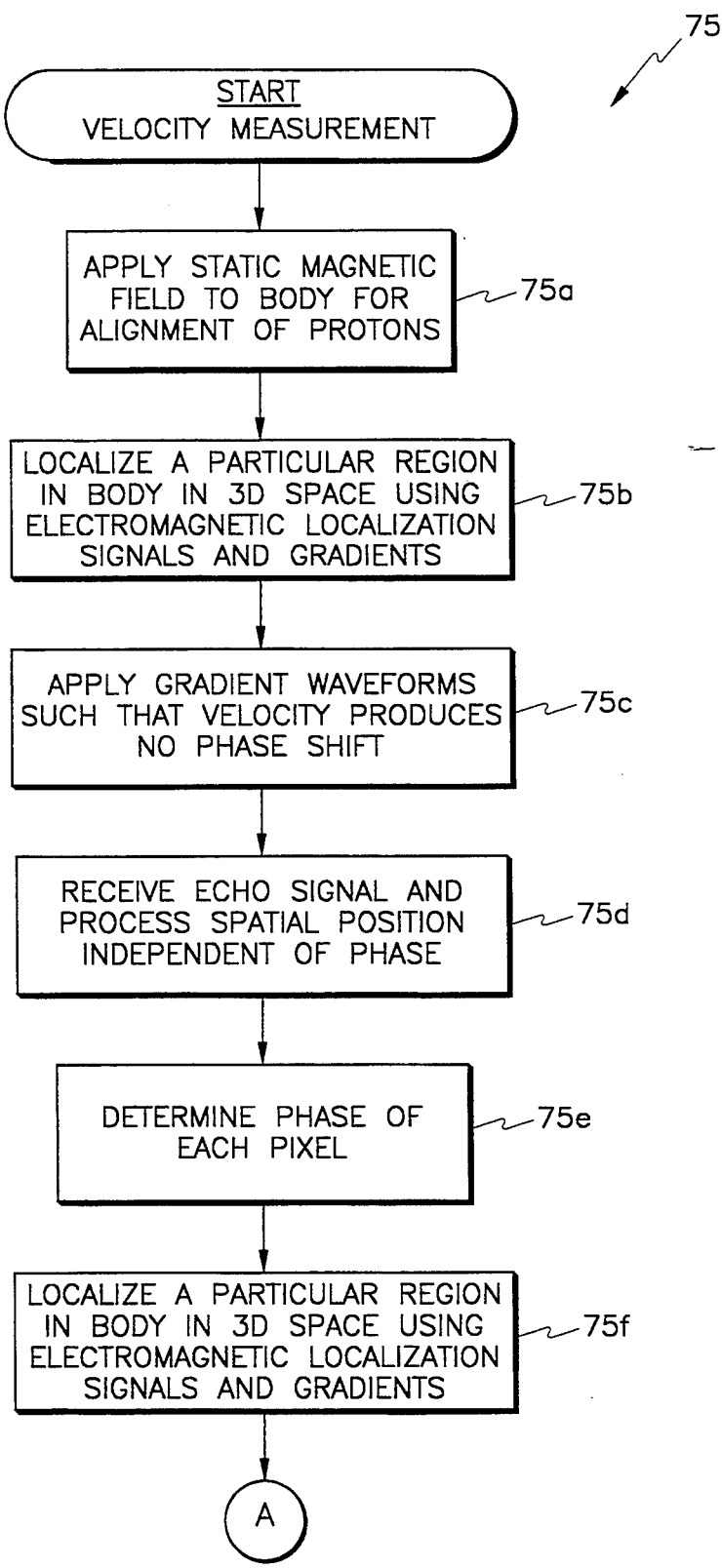
FIGS. 12A and 12B show a flow chart of an instantaneous velocity measurement process of the present invention.
Figure 12B:
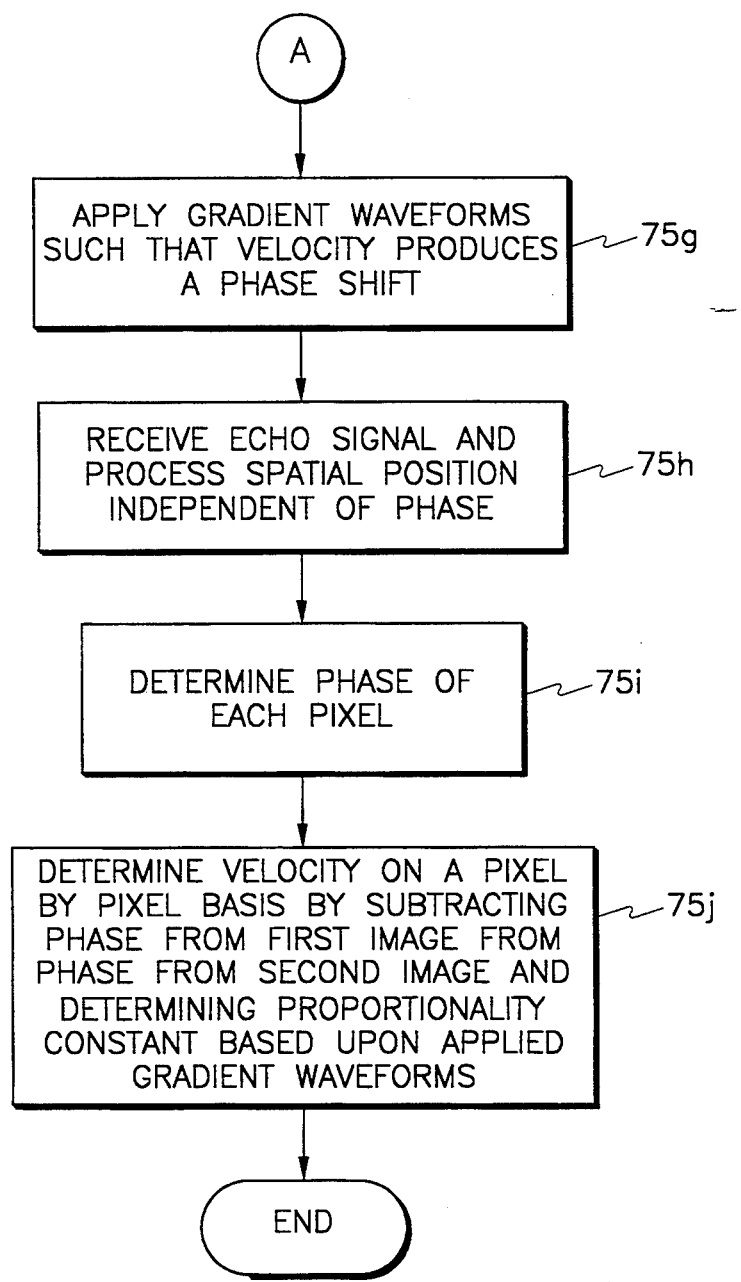

The novel instantaneous velocity measurement process 75 for determining instantaneous velocities is illustrated in a flow chart of FIG. 12 with blocks 75a–75j. A first image is created using the 2D slice selection sequence with gradient waveforms shaped such that phase shift due to fluid velocity are eliminated in all three dimensions. This first image is processed using frequency only for spatial localization, and the phase of each pixel is determined. See blocks 75a–75e.

Next, a second image is created using the 2D slice selection sequence with gradient waveforms shaped to yield a phase shift which is proportional to velocity in the direction of interest. This second image is processed using frequency only for spatial localization, and the phase of each pixel is determined. See blocks 75f–75i. Generation of the first and second images occurs at flow chart blocks 75a–75d of FIG. 12.

The phase from the first image are then subtracted from the phase of the second image on a pixel-by-pixel basis in order to generate phase shifts, from which virtually instantaneous velocities may be determined at each pixel location. See flow chart block 75j. A simple analysis of the shape of the magnetic gradient waveform yields a proportionality constant between phase shift and velocity. This computation can be performed automatically on most machines. The phase shifts are then brought into suitable postprocessing software, such as a spreadsheet, and converted to velocity values or the phase shifts can stand alone without postprocessing to create a phase velocity angiogram. A phase velocity angiogram is essentially a picture of a blood vessel with pixel intensity proportional to velocity.

Furthermore, any convective acceleration in the fluid flow can create an additional phase shift which may cause these foregoing instantaneous velocity measurements to be in slight error. Therefore, the above process 75 is preferably used in combination with magnetic gradient waveforms which nullify phase shifts due to acceleration. Likewise, variation in spatial location will create an additional phase shift, and therefore all magnetic gradient waveforms which are utilized should nullify phase shifts due to spatial variation within a gradient direction. The above-described procedure for the accurate measurement of turbulent velocity can be used with any non-phase encoded sequence (such as the projection reconstruction method). The resultant velocities, however, will be an average over multiple acquisitions rather than an instantaneous value.

Acceleration Compensation Process

In accordance with another feature of the present invention, the inventors have determined that signal loss in a magnetic resonance image of fluid flow having varying cross-section results from a range of fluid accelerations, or said another way, convective acceleration, around the varying cross-section. This type of signal loss is more prevalent in fluid flow regions with progressively decreasing cross-sectional area (for instance, prior to constriction 26 in fluid channel 28 of FIG. 3), but also exists to a more limited extent in fluid flow regions with progressively increasing cross-sectional area (for example, after constriction 26 in fluid channel 28 of FIG. 3). This type of signal loss is substantially eliminated by modifying the shape of magnetic gradient waveforms such that the image is insensitive to acceleration of the fluid flow, and preferably, also insensitive to position and velocity of the fluid flow, which can also contribute to this type of signal loss.

Figure 13:
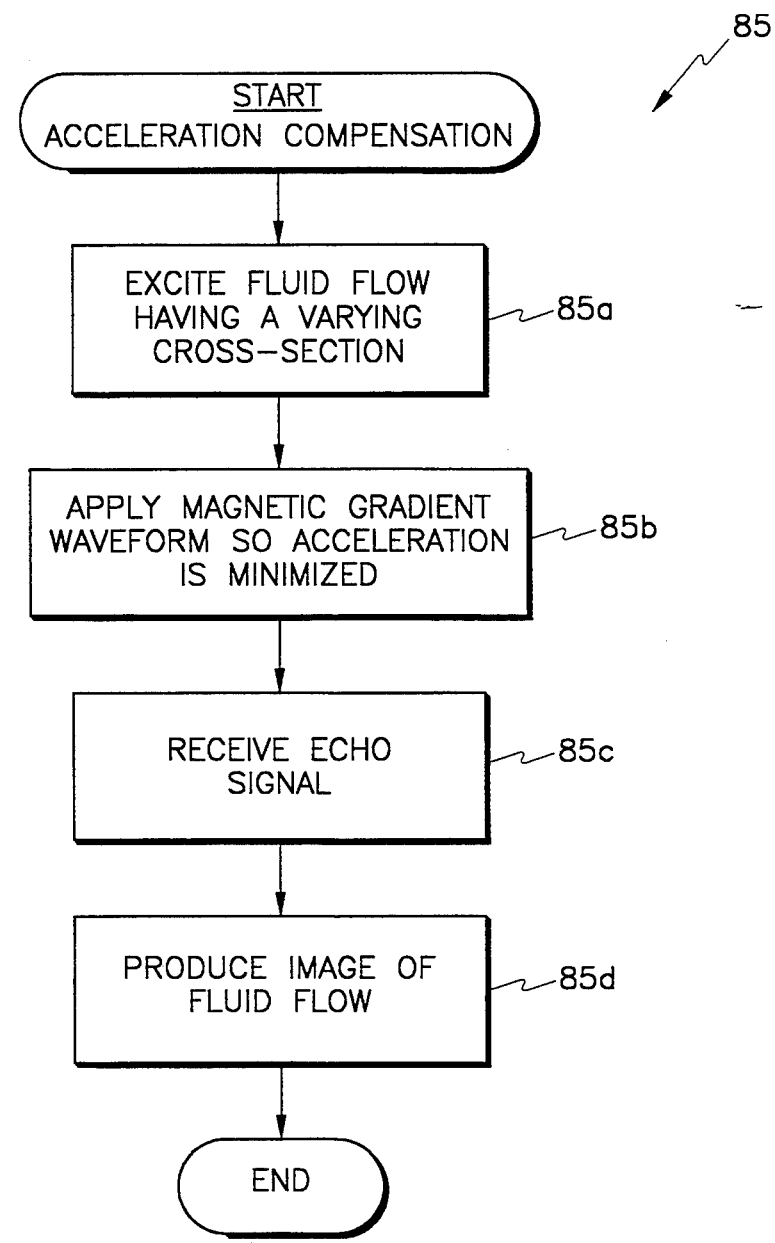
FIG. 13 is a flow chart of an acceleration compensation process of the present invention.

An acceleration compensation process 85 for this purpose is described briefly hereafter. Flow chart blocks 85a–85d of FIG. 13 parallel this discussion. First, fluid flowing through a part of a fluid channel having a varying cross-section is excited. A shaped magnetic gradient waveform is applied to the part so that changes in the electromagnetic echo signal resulting from acceleration of the fluid within the part are substantially eliminated. The electromagnetic echo signal is received from the part. Finally, an image of the fluid is produced from the electromagnetic echo signal.

The motion of protons in a magnetic resonance angiogram effect the image by altering the phase of the electromagnetic echo signal 14'. The phase of the echo signal 14' from a proton is given by $$\phi(\vec{r},t) = \gamma \int_{t_o}^{t_o + t} \overline{G}(t) \cdot \vec{r}(t) dt, \quad (1)$$

where G is the applied gradient waveform and r is the position of the proton. The position vector, r, can be decomposed as $$\vec{r}(t) = \vec{r}_o + \vec{v}_o t + \vec{a}_o t^2 + \ldots, \quad (2)$$

where $r_o$ is the position of the particle, vo is the velocity of the particle and ao is the acceleration of the particle. The net phase shift due to acceleration can then be represented by $$\phi(\tau) = a\gamma \int_o^\tau t^2 G(t) dt, \quad (3)$$

where G(t) is the magnetic gradient waveform in the direction of the acceleration, and t is the duration of the applied magnetic gradient. It should be noted that "acceleration" in the context of this document is to be construed broadly to include deceleration.

If there is a range of acceleration values within a pixel, there will also be a range of phase shifts within the pixel. Because the electromagnetic echo signal 14' from a given pixel is the result of the integration of the echo signal 14' from the individual fluid particles within the fluid, if this range of phase values is too large, the resultant echo signal 14' will be zero. The solution to this problem is to design a magnetic gradient waveform which will not yield a phase shift due to acceleration. Therefore, a magnetic gradient waveform must be designed for which:

$$\int_o^\tau t^2 G(t) dt = 0 \quad (4)$$

Figure 14:
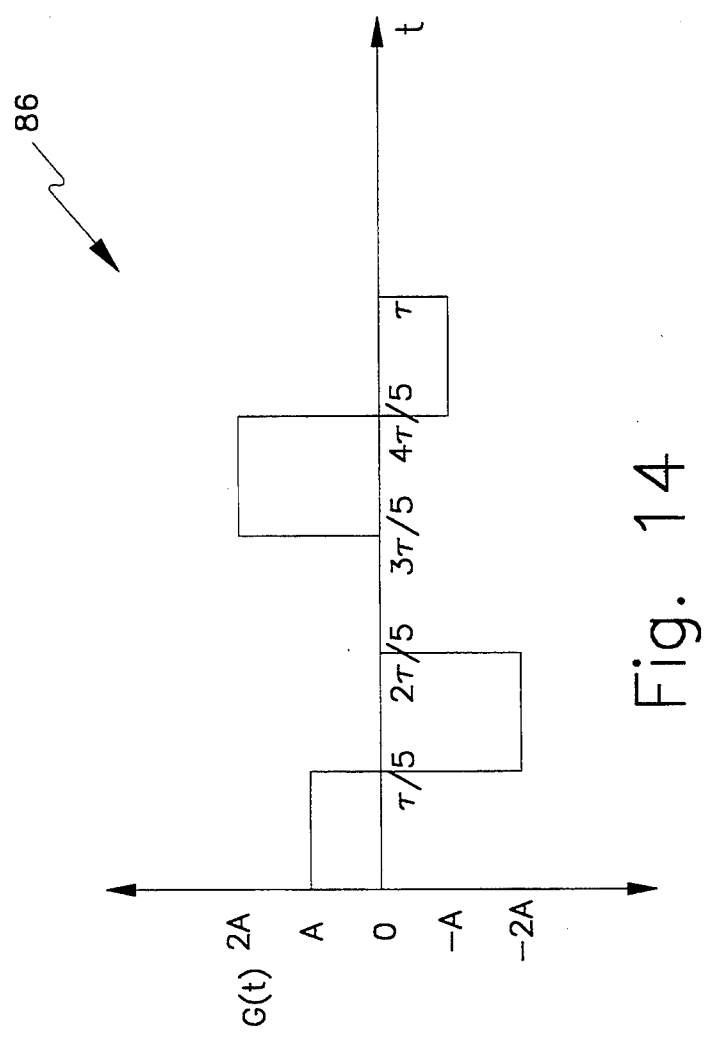
FIG. 14 is a graph showing a magnetic gradient waveform for the acceleration compensation process of FIG. 13.

FIG. 14 illustrates an acceleration compensated gradient waveform 86. As noted above, an acceleration compensated gradient waveform is one for which the integral of t squared times the gradient amplitude is zero. Similarly, this gradient waveform 86 is velocity and position compensated, and therefore spatial variation of position, velocity, or acceleration would not cause a phase distribution using this waveform 86.

The waveform 86 may be utilized in combination with any of the aforementioned sequences 55, 65 (FIG. 8, 11) by replacing the waveform 86 with a generic magnetic gradient waveform. This generic magnetic gradient waveform must be modified depending upon the actual sequence used. For example, the 2D slice selection sequence involves a 180 degree refocusing pulse. After this pulse, the inverse of all desired gradient amplitudes in the waveform of FIG. 8 should be used. Also, if one wishes to obtain velocity measurements using the 2D slice selection process 56, the waveform of FIG. 14 should be modified such that it is position and acceleration compensated, but not velocity compensated. Once again, the processes for actually modifying these waveforms are well known to those skilled in the art.

The several processes of the present invention as described in this document have a wide range of applications. For example, these processes may be used in generating images of angiography, ureters, cerebrospinal fluid, pipe flows, channel flows, chemical processes, internal combustion engines, rockets, etc.

Finally, it will be obvious to those skilled in the art that many other variations may be made to the embodiments described herein without departing from the novel teachings and principles of the present invention. All such variations are intended to be incorporated herein and within the scope of the present invention, as set forth in the following claims.

Wherefore, the following is claimed:

1. A process for producing magnetic resonance images of fluid flow within a body without signal loss resulting from fluid turbulence, comprising the steps of:
    applying a static magnetic field to said body for alignment of protons within said body;
    isolating a particular region of said body having the turbulent fluid flow by exciting a slice region along the body via applying a slice selection magnetic gradient in combination with a slice selection electromagnetic signal at a frequency which specifies the location of said slice region, and by individually exciting a row region within said slice region with an electromagnetic excitation signal in combination with a row selection magnetic gradient;

frequency encoding said particular region of said body;

receiving an electromagnetic echo signal from said particular region; and producing an image of the fluid flow within said particular region by processing said electromagnetic echo signal independent of the phase of said electromagnetic echo signal.

2. The process of claim 1, wherein the step of encoding comprises applying a magnetic gradient parallel to said particular region to provoke echo signals.

3. The process of claim 1, wherein the step of encoding comprises individually exciting pixel regions within said particular region by applying a pixel selection electromagnetic signal which particularly specifies the location of each pixel regions.

4. The process of claim 1, wherein the step of exciting said slice region comprises the step of applying said electromagnetic excitation signal for a length of time necessary to tip protons in said slice approximately 90° out of alignment with said static magnetic field.

5. The process of claim 1, wherein the step of exciting said row region comprises the step of applying said electromagnetic excitation signal of appropriate frequency for a length of time necessary to tip protons in said slice approximately 270° out of alignment with said static magnetic field, 6. The process of claim 1, wherein the step of determining producing an image comprises the step of transforming said echo signal via a Fourier transform operation.

7. The process of claim 1, further comprising the step of generating an instantaneous velocity of fluid flowing through said slice region from said echo signal.

8. The process of claim 1, further comprising the steps of:

generating a plurality of instantaneous velocities for fluid flowing through said slice region over a time period; and determining fluctuation velocities with said plurality of instantaneous velocities.

9. The process of claim 8, further comprising the step of determining average velocities from said instantaneous velocities.

10. A two dimensional slice selection process for producing magnetic resonance images within a body, comprising the steps of:

applying a static magnetic field to said body for alignment of protons within said body;

exciting a slice region along the body by applying a slice selection magnetic gradient in combination with a slice selection electromagnetic signal at a frequency which specifies the location of said slice region;

individually exciting row regions within said slice region by applying a row selection magnetic gradient in combination with a row selection electromagnetic inversion signal at another frequency which particularly inverts each of said row regions;

frequency encoding pixel regions within said row regions by applying a magnetic gradient parallel to said row regions within said slice region to provoke echo signals;

receiving said echo signals;

determining pixel data corresponding to each of said pixel regions; and generating an image of said slice region from said pixel data.

11. The process of claim 10, further comprising the step of generating an instantaneous velocity of fluid flowing through said slice region from said pixel data.

12. The process of claim 10, further comprising the steps of:

generating a plurality of instantaneous velocities for fluid flowing through said slice region over a time period; and determining fluctuation velocities with said plurality of instantaneous velocities.

13. The process of claim 12, further comprising the step of determining average velocities from said instantaneous velocities.

14. The process of claim 5, wherein the step of exciting said slice region comprises the step of applying said electromagnetic excitation signal for a length of time necessary to tip protons in said slice approximately 90° out of alignment with said static magnetic field.

15. The process of claim 10, wherein the step of exciting said row region comprises the step of applying said electromagnetic excitation signal of appropriate frequency for a length of time necessary to tip protons in said slice approximately 270° out of alignment with said static magnetic field.

16. The process of claim 10, wherein the step of determining the pixel data comprises the step of transforming said echo signal via a Fourier transform operation.

17. A system for producing magnetic resonance images of fluid flow within a body without signal loss resulting from fluid turbulence comprising:

means for applying a static magnetic field to said body for alignment of protons within said body;

means for isolating a particular region of said body having the turbulent fluid flow by exciting a slice region along the body via applying a slice selection magnetic gradient in combination with a slice selection electromagnetic signal at a frequency which specifies the location of said slice region, and by individually exciting a row region within said slice region with an electromagnetic excitation signal in combination with a row selection magnetic gradient;

means for frequency encoding said particular region of said body;

means for receiving an electromagnetic echo signal from said particular region; and means for producing an image of the fluid flow within said particular region by processing said electromagnetic echo signal independent of the phase of said electromagnetic echo signal.

18. The system of claim 17, further comprising means for generating an instantaneous velocity of fluid flowing through said slice region from said echo signal.

19. The system of claim 17, further comprising:

means for generating a plurality of instantaneous velocities for fluid flowing through said slice region over a time period; and means for determining fluctuation velocities with said plurality of instantaneous velocities.

20. The system of claim 19, further comprising means for determining average velocities from said instantaneous velocities.

21. The system of claim 17, wherein the means for encoding comprises means for applying a magnetic gradient parallel to said particular region to provoke echo signals.

22. The system of claim 17, wherein the means for encoding comprises means for individually exciting pixel regions within said particular region by applying a pixel selection electromagnetic signal which particularly specifies the location of each pixel regions.

* * * * *